(12) United States Patent
Kim

(10) Patent No.: US 9,466,396 B2
(45) Date of Patent: Oct. 11, 2016

(54) SEMICONDUCTOR DEVICES AND SEMICONDUCTOR SYSTEMS INCLUDING THE SAME

(71) Applicant: SK hynix Inc., Icheon-si Gyeonggi-do (KR)

(72) Inventor: Na Yeon Kim, Incheon (KR)

(73) Assignee: SK hynix Inc., Icheon-si, Gyeonggi-do (KY)

( * ) Notice: Subject to any disclaimer, the term of this patent is extended or adjusted under 35 U.S.C. 154(b) by 0 days.

(21) Appl. No.: 14/747,047

(22) Filed: Jun. 23, 2015

(65) Prior Publication Data

US 2016/0254802 A1  Sep. 1, 2016

(30) Foreign Application Priority Data

Feb. 26, 2015 (KR) .................. 10-2015-0027587

(51) Int. Cl.
*G11C 29/00* (2006.01)
*G11C 29/50* (2006.01)
*G11C 29/02* (2006.01)
*G11C 29/56* (2006.01)

(52) U.S. Cl.
CPC ......... *G11C 29/50012* (2013.01); *G11C 29/02* (2013.01); *G11C 29/022* (2013.01); *G11C 29/023* (2013.01); *G11C 29/56012* (2013.01)

(58) Field of Classification Search
CPC ... G11C 29/02; G11C 29/022; G11C 29/023; G11C 29/50012; G11C 29/56; G11C 29/56012
See application file for complete search history.

(56) References Cited

U.S. PATENT DOCUMENTS

| 6,807,116 | B2* | 10/2004 | Yamazaki | ........ G11C 29/56012 365/189.05 |
| 8,116,155 | B2* | 2/2012 | Baek | ...................... G11C 29/02 365/189.05 |
| 9,025,410 | B2* | 5/2015 | Chu | ....................... G11C 17/16 365/193 |
| 2004/0189360 | A1 | 9/2004 | Sekiguchi et al. | |
| 2015/0248925 | A1* | 9/2015 | Kashyap | .............. G11C 29/022 365/189.02 |

FOREIGN PATENT DOCUMENTS

KR  1020100001828 A  1/2010

* cited by examiner

*Primary Examiner* — Patrick O'Neill
(74) *Attorney, Agent, or Firm* — William Park & Associates Ltd.

(57) ABSTRACT

Semiconductor devices are provided. One of the semiconductor devices may include a synthetic clock generator and a flag signal generator. The synthetic clock generator may be configured to generate a synthetic clock signal in response to a test enablement signal. The synthetic clock signal may be generated from a clock signal to include a first section pulse and a second section pulse having different pulse widths. The flag signal generator may be configured to latch a test signal in response to the synthetic clock signal to generate a flag signal.

22 Claims, 7 Drawing Sheets

US 9,466,396 B2

SEMICONDUCTOR DEVICES AND SEMICONDUCTOR SYSTEMS INCLUDING THE SAME

CROSS-REFERENCE TO RELATED APPLICATION

The present application claims priority under 35 U.S.C 119(a) to Korean Application No. 10-2015-0027587, filed on Feb. 26, 2015, in the Korean Intellectual Property Office, which is incorporated herein by reference in its entirety as set forth in full.

BACKGROUND

1. Technical Field

Various embodiments generally relate to semiconductor systems, and more particularly, semiconductor systems including an efficient measurement scheme of a setup time and a hold time.

2. Related Art

Synchronous dynamic random access memory (SDRAM) devices may receive or output data using an internal clock signal. The internal clock signal is synchronized with an external clock signal. Accordingly, the SDRAM devices may operate at a high speed because the data is transmitted in response to the internal clock signal.

In the SDRAM devices, it may be important to guarantee a setup time and a hold time of data with respect to the internal clock signal. In this way, data may be normally read out or written to the SDRAM device. In certain situations, the data should be applied to input pins of the SDRAM devices earlier than a switching moment of the external clock signal by at least the setup time. Also, the data should be maintained for at least the hold time starting from the switching moment of the external clock signal. That is, the setup time equates to a time corresponding to a front portion of a data valid window, and the hold time equates to a time corresponding to a rear portion of the data valid window.

SUMMARY

According to an embodiment, a semiconductor device may include a synthetic clock generator and a flag signal generator. The synthetic clock generator may be configured to generate a synthetic clock signal in response to a test enablement signal. The synthetic clock signal may be generated from a clock signal to include a first section pulse and a second section pulse having different pulse widths. The flag signal generator may be configured to latch a test signal in response to the synthetic clock signal to generate a flag signal.

According to an embodiment, a semiconductor system may include a first semiconductor device and a second semiconductor device. The first semiconductor device may be configured to generate a test enablement signal, a clock signal and a test signal. The second semiconductor device may be configured to generate a synthetic clock signal in response to the test enablement signal and may latch the test signal in response to the synthetic clock signal to generate a flag signal. The synthetic clock signal may be generated from the clock signal to include a first section pulse and a second section pulse having different pulse widths. The second semiconductor device may be configured to apply the flag signal to the first semiconductor device.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Various embodiments may be directed to semiconductor devices and semiconductor systems including the same.

Figure 1:
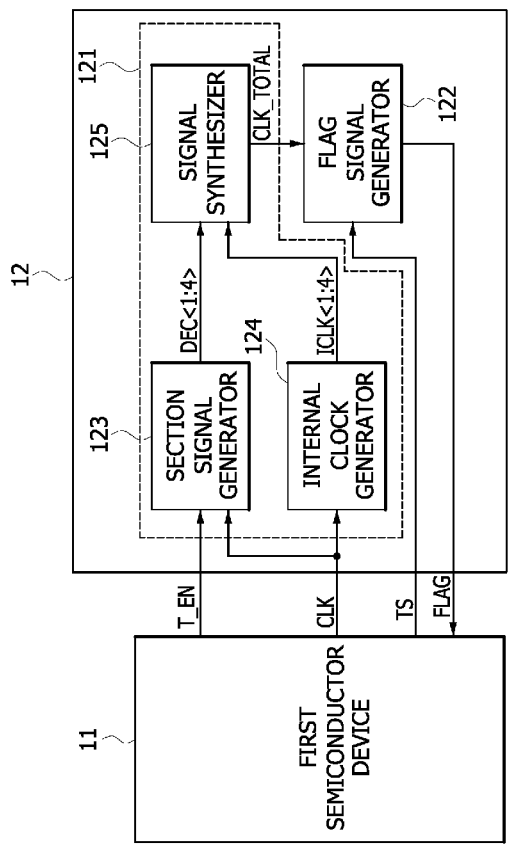
FIG. 1 is a block diagram illustrating a representation of an example of a semiconductor system according to an embodiment.

Referring to FIG. 1, a semiconductor system according to an embodiment may include a first semiconductor device 11 and a second semiconductor device 12.

The first semiconductor device 11 may generate a test enablement signal T_EN, a clock signal CLK and a test signal TS. The first semiconductor device 11 may apply the test enablement signal T_EN, the clock signal CLK and the test signal TS to the second semiconductor device 12. The test enablement signal T_EN may be enabled if a test operation for measuring a setup time and a hold time of the test signal TS is executed. The test signal TS may be a periodic signal. The test signal TS may be, for example but not limited to, a data signal, an address signal, a command signal, or an internal signal of the second semiconductor device 12 according to an embodiment. The first semiconductor device 11 may be, for example but not limited to, a controller or test equipment according to an embodiment.

The second semiconductor device 12 may include a synthetic clock generator 121 and a flag signal generator 122. The synthetic clock generator 121 may include a section signal generator 123, an internal clock generator 124 and a signal synthesizer 125. The section signal generator 123 may generate first to fourth section signals DEC<1:4> from the clock signal CLK while the test enablement signal T_EN is enabled. The first to fourth section signals DEC<1:4> may be sequentially enabled. The internal clock generator 124 may generate first to fourth internal clock signals ICLK<1:4> from the clock signal CLK. The signal synthesizer 125 may synthesize the first to fourth section signals DEC<1:4> and the first to fourth internal clock signals ICLK<1:4> to generate a synthetic clock signal CLK_TO- TAL. Configurations and operations of the section signal generator 123, the internal clock generator 124 and the signal synthesizer 125 will be described below with reference to FIGS. 2, 3 and 4 later.

The flag signal generator 122 may latch the test signal TS in synchronization with the synthetic clock signal CLK_TOTAL to generate a flag signal FLAG. For example, the flag signal generator 122 may generate the flag signal FLAG having a logic "high" level if the test signal TS having a logic "high" level is latched in synchronization with a rising edge of the synthetic clock signal CLK_TOTAL. For example, the flag signal generator 122 may generate the flag signal FLAG having a logic "low" level if the test signal TS having a logic "low" level is latched in synchronization with a rising edge of the synthetic clock signal CLK_TOTAL. The flag signal generator 122 may be realized using a general flip-flop circuit. An operation of the flag signal generator 122 will be described below with reference to FIG. 6 later.

Figure 2:
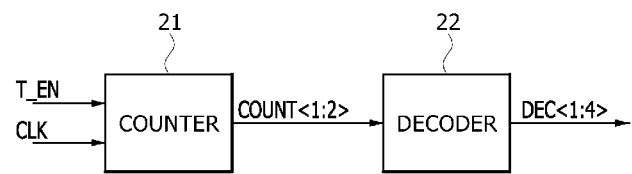
FIG. 2 is a block diagram illustrating a representation of an example of a section signal generator included in the semiconductor system of FIG. 1.

Referring to FIG. 2, the section signal generator 123 may include a counter 21 and a decoder 22.

The counter 21 may generate first and second count signals COUNT<1:2>. The first and second count signals COUNT<1:2> may be counted in synchronization with the clock signal CLK while the test enablement signal T_EN is enabled. For example, the counter 21 may generate the first and second count signals COUNT<1:2> that are sequentially counted up to have logic level combinations of '00', '01', '10' and '11' whenever a level transition of the clock signal CLK occurs while the test enablement signal T_EN is enabled. For example, the logic level combination of '01' may mean that the first count signal COUNT<1> has a logic "high" level and the second count signal COUNT<2> has a logic "low" level. If the first and second count signals COUNT<1:2> having a logic level combination of '11' are counted up in synchronization with the clock signal CLK once, the first and second count signals COUNT<1:2> may change to have a logic level combination of '00'.

The decoder 22 may decode the first and second count signals COUNT<1:2> to generate the first to fourth section signals DEC<1:4>. The first to fourth section signals DEC<1:4> may be sequentially enabled. For example, the decoder 22 may generate the first section signal DEC<1> enabled to have a logic "high" level if the first and second count signals COUNT<1:2> have a logic level combination of '00'. For example, the decoder 22 may generate the second section signal DEC<2> enabled to have a logic "high" level if the first and second count signals COUNT<1:2> have a logic level combination of '01'. For example, the decoder 22 may generate the third section signal DEC<3> enabled to have a logic "high" level if the first and second count signals COUNT<1:2> have a logic level combination of '10'. For example, the decoder 22 may generate the fourth section signal DEC<4> enabled to have a logic "high" level if the first and second count signals COUNT<1:2> have a logic level combination of '11'. The logic level combinations of the first and second count signals COUNT<1:2> for sequentially enabling the first to fourth section signals DEC<1:4> may be set to be different according to the various embodiments.

Figure 3:
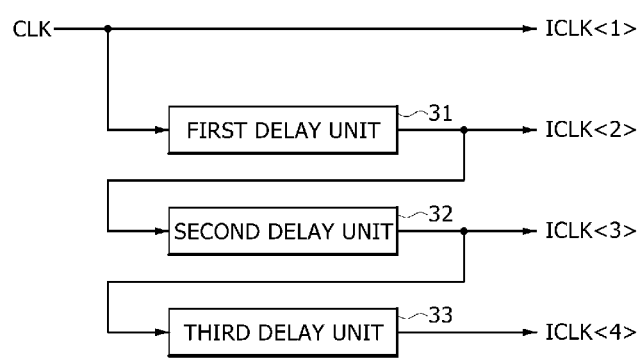
FIG. 3 is a block diagram illustrating a representation of an example of an internal clock generator included in the semiconductor system of FIG. 1.

Referring to FIG. 3, the internal clock generator 124 may include a first delay unit 31, a second delay unit 32 and a third delay unit 33. The internal clock generator 124 may directly output the clock signal CLK as the first internal clock signal ICLK<1>. The first delay unit 31 may delay the first internal clock signal ICLK<1> by a predetermined time to generate the second internal clock signal ICLK<2>. The second delay unit 32 may delay the second internal clock signal ICLK<2> by a predetermined time to generate the third internal clock signal ICLK<3>. The third delay unit 33 may delay the third internal clock signal ICLK<3> by a predetermined time to generate the fourth internal clock signal ICLK<4>. The delay time of the first, second and third delay units 31, 32 and 33 may be set to be different according to the various embodiments.

Figure 4:
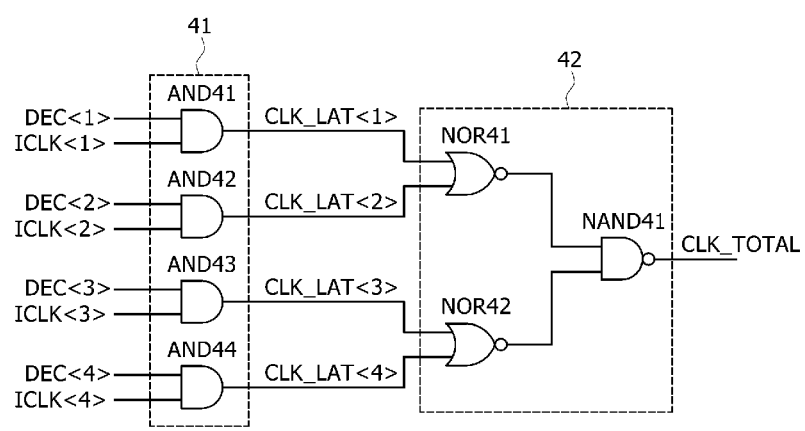
FIG. 4 is a logic circuit diagram illustrating a representation of an example of a signal synthesizer included in the semiconductor system of FIG. 1.

Referring to FIG. 4, the signal synthesizer 125 may include a latch clock generator 41 and a clock synthesizer 42.

The latch clock generator 41 may include a plurality of logic gates, for example but not limited to, AND gates AND41, AND42, AND43 and AND44. The latch clock generator 41 may latch and output the first internal clock signal ICLK<1> as a first latch clock signal CLK_LAT<1> while the first section signal DEC<1> is enabled. The latch clock generator 41 may latch and output the second internal clock signal ICLK<2> as a second latch clock signal CLK_LAT<2> while the second section signal DEC<2> is enabled. The latch clock generator 41 may latch and output the third internal clock signal ICLK<3> as a third latch clock signal CLK_LAT<3> while the third section signal DEC<3> is enabled. The latch clock generator 41 may latch and output the fourth internal clock signal ICLK<4> as a fourth latch clock signal CLK_LAT<4> while the fourth section signal DEC<4> is enabled. The latch clock generator 41 may be realized using, for example but not limited to, a flip-flop circuit or an SR latch circuit, etc.

The clock synthesizer 42 may include logic gates, for example but not limited to, NOR gates NOR41 and NOR42 and a NAND gate NAND41. The clock synthesizer 42 may synthesize the first to fourth latch clock signals CLK_LAT<1:4> to generate the synthetic clock signal CLK_TOTAL including all of pulses of the first to fourth latch clock signals CLK_LAT<1:4>.

An example of an operation of the synthetic clock generator 121 having an aforementioned configuration will be described hereinafter with reference to FIG. 5.

First, if the test operation is executed so that the test enablement signal T_EN is enabled to have a logic "high" level, the first and second count signals COUNT<1:2> may be sequentially counted up in synchronization with the clock signal CLK. That is, the first and second count signals COUNT<1:2> may have a logic level combination of '00' during a first unit period (T1~T2) from a first point of time T1 until a second point of time T2. The first and second count signals COUNT<1:2> may have a logic level combination of '01' during a second unit period (T2~T3) from the second point of time T2 until a third point of time T3. The first and second count signals COUNT<1:2> may have a logic level combination of '10' during a third unit period (T3~T4) from the third point of time T3 until a fourth point of time T4. The first and second count signals COUNT<1:2> may have a logic level combination of '11' during a fourth unit period (T4~T5) from the fourth point of time T4 until a fifth point of time T5. The first, second, third, and fourth unit periods (T1~T2, T2~T3, T3~T4 and T4~T5) may have the same period width.

Next, the first and second count signals COUNT<1:2> may be decoded to generate the first to fourth section signals DEC<1:4>. The first to fourth section signals DEC<1:4> may be sequentially enabled to have a logic "high" level. During the first unit period (T1~T2), the first section signal DEC<1> may be enabled to have a logic "high" level by the first and second count signals COUNT<1:2> having a logic level combination of '00'. During the second unit period (T2~T3), the second section signal DEC<2> may be enabled to have a logic "high" level by the first and second count signals COUNT<1:2> having a logic level combination of '01'. During the third unit period (T3~T4), the third section signal DEC<3> may be enabled to have a logic "high" level by the first and second count signals COUNT<1:2> having a logic level combination of '10'. During the fourth unit period (T4~T5), the fourth section signal DEC<4> may be enabled to have a logic "high" level by the first and second count signals COUNT<1:2> having a logic level combination of '11'.

Next, the first to fourth internal clock signals ICLK<1:4> may be generated from the clock signal CLK. The first internal clock signal ICLK<1> may be generated by directly outputting the clock signal CLK from the first point of time T1. The second internal clock signal ICLK<2> may be generated by delaying the clock signal CLK by a first delay time TD1 from the second point of time T2. The third internal clock signal ICLK<3> may be generated by delaying the clock signal CLK by a second delay time TD2 from the third point of time T3. The fourth internal clock signal ICLK<4> may be generated by delaying the clock signal CLK by a third delay time TD3 from the fourth point of time T4.

Next, the first to fourth internal clock signals ICLK<1:4> may be latched in synchronization with the first to fourth section signals DEC<1:4> to generate the first to fourth latch clock signals CLK_LAT<1:4>. For example, while the first section signal DEC<1> is enabled to have a logic "high" level, the first internal clock signal ICLK<1> may be latched to generate the first latch clock signal CLK_LAT<1> which is enabled to have a logic "high" level during the first unit period (T1~T2). While the second section signal DEC<2> is enabled to have a logic "high" level, the second internal clock signal ICLK<2> may be latched to generate the second latch clock signal CLK_LAT<2> which is enabled to have a logic "high" level during a period from a point of time that the first delay time TD1 elapses after the second point of time T2 until the third point of time T3. While the third section signal DEC<3> is enabled to have a logic "high" level, the third internal clock signal ICLK<3> may be latched to generate the third latch clock signal CLK_LAT<3> which is enabled to have a logic "high" level during a period from a point of time that the second delay time TD2 elapses after the third point of time T3 until the fourth point of time T4. While the fourth section signal DEC<4> is enabled to have a logic "high" level, the fourth internal clock signal ICLK<4> may be latched to generate the fourth latch clock signal CLK_LAT<4> which is enabled to have a logic "high" level during a period from a point of time that the third delay time TD3 elapses after the fourth point of time T4 until the fifth point of time T5.

Finally, the first to fourth latch clock signals CLK_LAT<1:4> may be synthesized to generate the synthetic clock signal CLK_TOTAL. The synthetic clock signal CLK_TOTAL may be generated to include a pulse of the first latch clock signal CLK_LAT<1> created in the first unit period (T1~T2). The synthetic clock signal CLK_TOTAL may be generated to include a pulse of the second latch clock signal CLK_LAT<2> created in the second unit period (T2~T3). The synthetic clock signal CLK_TOTAL may be generated to include a pulse of the third latch clock signal CLK_LAT<3> created in the third unit period (T3~T4). The synthetic clock signal CLK_TOTAL may be generated to include a pulse of the fourth latch clock signal CLK_LAT<4> created in the fourth unit period (T4~T5).

Figure 6:
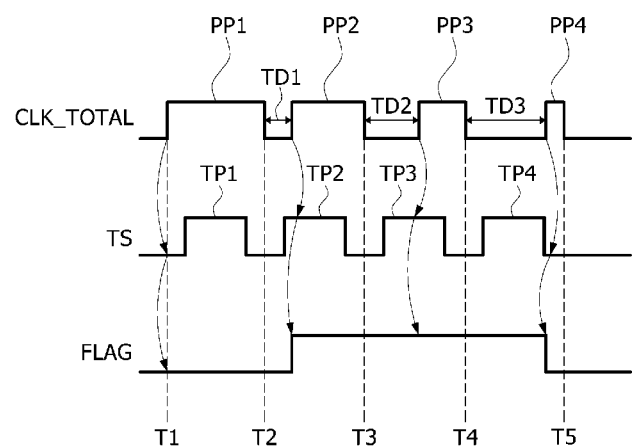
FIG. 6 is a timing diagram illustrating a representation of an example of an operation of a flag signal generator included in the semiconductor system of FIG. 1.

An operation of the flag signal generator 122 for generating the flag signal FLAG will be described hereinafter with reference to FIG. 6.

Figure 5:
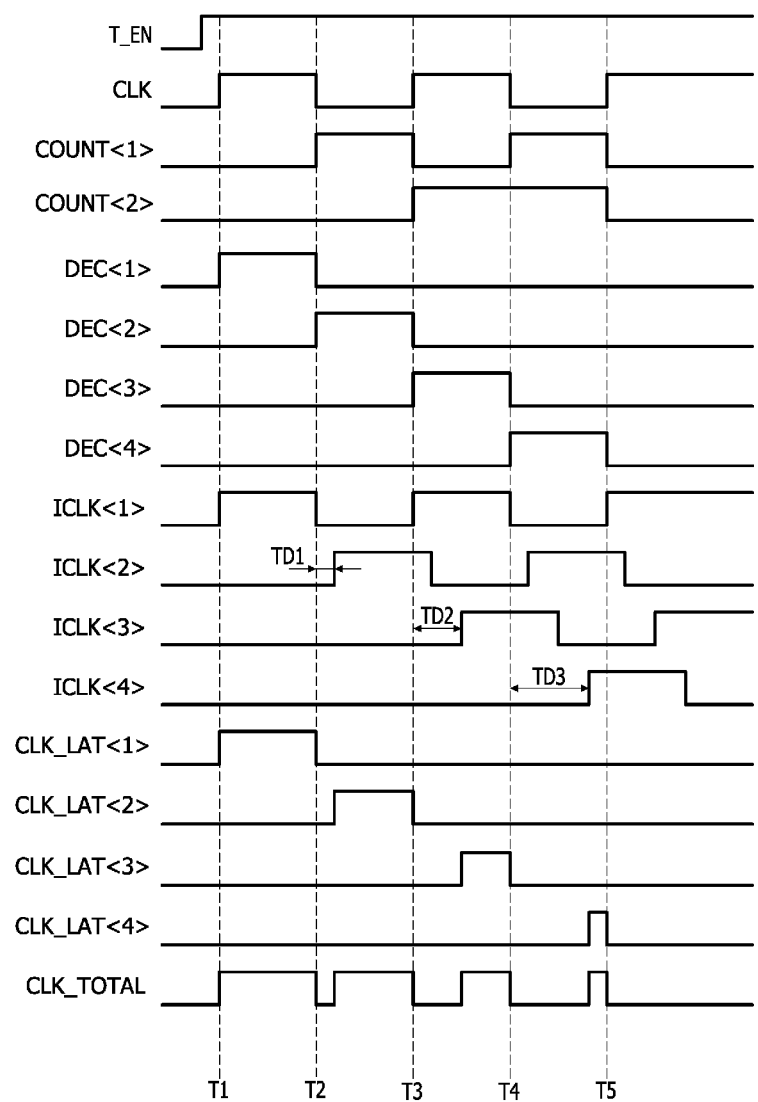
FIG. 5 is a timing diagram illustrating a representation of an example of an operation of a synthetic clock generator included in the semiconductor system of FIG. 1.

Referring to FIG. 5, the synthetic clock signal CLK_TOTAL may be generated to include a first section pulse PP1 created in the first unit period (T1~T2). The synthetic clock signal CLK_TOTAL may be generated to include a second section pulse PP2 created in the second unit period (T2~T3). The synthetic clock signal CLK_TOTAL may be generated to include a third section pulse PP3 created in the third unit period (T3~T4). The synthetic clock signal CLK_TOTAL may be generated to include a fourth section pulse PP4 created in the fourth unit period (T4~T5). The first section pulse PP1 may have a pulse width corresponding to the first unit period (T1~T2). The second section pulse PP2 may have a pulse width corresponding to a period from a point of time that the first delay time TD1 elapses after the second point of time T2 until the third point of time T3. The third section pulse PP3 may have a pulse width corresponding to a period from a point of time that the second delay time TD2 elapses after the third point of time T3 until the fourth point of time T4. The fourth section pulse PP4 may have a pulse width corresponding to a period from a point of time that the third delay time TD3 elapses after the fourth point of time T4 until the fifth point of time T5.

The test signal TS may be latched in synchronization with the synthetic clock signal CLK_TOTAL to generate the flag signal FLAG. The flag signal FLAG may have a logic "low" level from the first point of time T1. A level of the flag signal FLAG may change from a logic "low" level into a logic "high" level at a point of time that the first delay time TD1 elapses from the second point of time TD2. The flag signal FLAG may continuously maintain a logic "high" level during the third unit period (T3~T4), and a level of the flag signal FLAG may change from a logic "high" level into a logic "low" level at a point of time that the third delay time TD3 elapses from the fourth point of time TD4.

The test signal TS may include a first test pulse TP1, a second test pulse TP2, a third test pulse TP3 and a fourth test pulse TP4 which are respectively created in the first, second, third and fourth unit periods (T1~T2), (T2~T3), (T3~T4) and (T4~T5) to have the same pulse width. A level transition of the flag signal FLAG from a logic "low" level into a logic "high" level may mean that a logic level of the second test pulse TP2 is stably changed into a logic "high" level earlier than a point of time that the first delay time TD1 elapses from the second point of time T2. For example, the first delay time TD1 in the second unit period (T2~T3) may be regarded as a setup time of the second test pulse TP2. A level transition of the flag signal FLAG from a logic "high" level into a logic "low" level may mean that a logic level of the fourth test pulse TP4 is stably changed into a logic "low" level after a point of time that the third delay time TD3 elapses from the fourth point of time T4. For example, the third delay time TD3 corresponding to a period from the fourth point of time T4 until a level transition point of the flag signal FLAG from a logic "high" level into a logic "low" level may be regarded as a hold time of the fourth test pulse TP4.

A semiconductor system according to an embodiment may simultaneously measure a setup time and a hold time of test pulses included in the test signal TS with the synthetic clock signal CLK_TOTAL including section pulses that have different pulse widths in unit periods. Thus, a signal, a setup time and a hold time of which have to be measured, may be converted into a periodic signal which is used as the test signal TS, and the setup time and the hold time may be simultaneously measured to reduce a test time.

Figure 7:
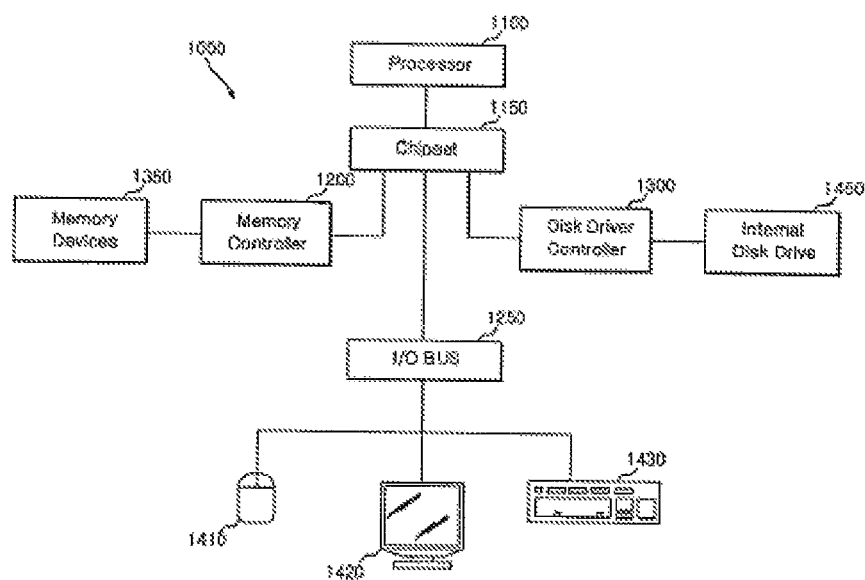
FIG. 7 illustrates a block diagram of an example of a representation of a system employing a semiconductor device and/or semiconductor system in accordance with the various embodiments discussed above with relation to FIGS. 1-6.

The semiconductor devices and/or semiconductor systems discussed above (see FIGS. 1-6) are particular useful in the design of memory devices, processors, and computer systems. For example, referring to FIG. 7, a block diagram of a system employing a semiconductor device and/or semiconductor system in accordance with the various embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor device and/or semiconductor system as discussed above with reference to FIGS. 1-6. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and/or semiconductor system as discussed above with relation to FIGS. 1-6, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 7 is merely one example of a system employing a semiconductor device and/or semiconductor system as discussed above with relation to FIGS. 1-6. In alternate embodiments, such as cellular phones or digital cameras, the components may differ from the embodiments illustrated in FIG. 7.

What is claimed is:

1. A semiconductor device comprising:
  a synthetic clock generator suitable for generating a synthetic clock signal in response to a test enablement signal, the synthetic clock signal being generated from a clock signal to include a first section pulse and a second section pulse; and
  a flag signal generator suitable for latching a test signal in response to the synthetic clock signal to generate a flag signal,
  wherein the first section pulse has a different pulse width than the second section pulse.

2. The semiconductor device of claim 1,
  wherein the test signal includes a first test pulse and a second test pulse;
  wherein the first test pulse is created in a first unit period from a first point of time until a second point of time; and
  wherein the second test pulse is created in a second unit period from the second point of time until a third point of time.

3. The semiconductor device of claim 2,
  wherein the first unit period and the second unit period have the same period width;
  wherein the first test pulse and the second test pulse have the same pulse width; and
  wherein the test signal is a periodic signal.

4. The semiconductor device of claim 2,
  wherein a pulse width of the first section pulse is set to be from a point of time that a first delay time elapses after the first point of time until the second point of time; and
  wherein a pulse width of the second section pulse is set to be from a point of time that a second delay time elapses after the second point of time until the third point of time.

5. The semiconductor device of claim 4, wherein the first delay time is shorter than the second delay time.

6. The semiconductor device of claim 1, wherein the synthetic clock generator includes:
  a section signal generator suitable for generating a first section signal and a second section signal from the clock signal in response to the test enablement signal;
  an internal clock generator suitable for generating a first internal clock signal and a second internal clock signal from the clock signal; and
  a signal synthesizer suitable for synthesizing the first and second section signals and the first and second internal clock signals to generate the synthetic clock signal.

7. The semiconductor device of claim 6, wherein the section signal generator includes:
  a counter suitable for generating a count signal counted in synchronization with the clock signal while the test enablement signal is enabled; and
  a decoder suitable for decoding the count signal to generate the first and second section signals, the first and second section signals sequentially enabled.

8. The semiconductor device of claim 6, wherein the second internal clock signal is generated by delaying the first internal clock signal by a predetermined time.

9. The semiconductor device of claim 6, wherein the signal synthesizer includes:
 a latch clock generator suitable for latching the first internal clock signal in response to the first section signal to generate a first latch clock signal and suitable for latching the second internal clock signal in response to the second section signal to generate a second latch clock signal; and
 a clock synthesizer suitable for synthesizing the first and second latch clock signals to generate the synthetic clock signal.

10. The semiconductor device of claim 9,
 wherein the latch clock generator latches and outputs the first internal clock signal as the first latch clock signal while the first section signal is enabled; and
 wherein the latch clock generator latches and outputs the second internal clock signal as the second latch clock signal while the second section signal is enabled.

11. The semiconductor device of claim 9, wherein the synthetic clock signal is generated to include a pulse of the first latch clock signal and a pulse of the second latch clock signal.

12. The semiconductor device of claim 1, wherein the flag signal generator latches the test signal in synchronization with a rising edge of the synthetic clock signal to generate the flag signal.

13. The semiconductor device of claim 1, wherein the test signal includes a data signal, an address signal, or a command signal.

14. A semiconductor system comprising:
 a first semiconductor device suitable for generating a test enablement signal, a clock signal, and a test signal; and
 a second semiconductor device suitable for generating a synthetic clock signal in response to the test enablement signal and suitable for latching the test signal in response to the synthetic clock signal to generate a flag signal,
 wherein the synthetic clock signal is generated from the clock signal to include a first section pulse and a second section pulse having different pulse widths, and
 wherein the second semiconductor device applies the flag signal to the first semiconductor device.

15. The semiconductor system of claim 14,
 wherein the test signal includes a first test pulse and a second test pulse;
 wherein the first test pulse is created in a first unit period from a first point of time until a second point of time; and
 wherein the second test pulse is created in a second unit period from the second point of time until a third point of time.

16. The semiconductor system of claim 15,
 wherein the first unit period and the second unit period have the same period width;
 wherein the first test pulse and the second test pulse have the same pulse width; and
 wherein the test signal is a periodic signal.

17. The semiconductor system of claim 15,
 wherein a pulse width of the first section pulse is set to be from a point of time that a first delay time elapses after the first point of time until the second point of time; and
 wherein a pulse width of the second section pulse is set to be from a point of time that a second delay time elapses after the second point of time until the third point of time.

18. The semiconductor system of claim 17, wherein the first delay time is shorter than the second delay time.

19. A semiconductor system of claim 14, wherein the second semiconductor device includes:
 a synthetic clock generator suitable for generating the synthetic clock signal in response to the test enablement signal, the synthetic clock signal being generated from the clock signal to include the first section pulse and the second section pulse having different pulse widths; and
 a flag signal generator suitable for latching the test signal in response to the synthetic clock signal to generate the flag signal.

20. The semiconductor system of claim 19, wherein the synthetic clock generator includes:
 a section signal generator suitable for generating a first section signal and a second section signal from the clock signal in response to the test enablement signal;
 an internal clock generator suitable for generating a first internal clock signal and a second internal clock signal from the clock signal; and
 a signal synthesizer suitable for synthesizing the first and second section signals and the first and second internal clock signals to generate the synthetic clock signal.

21. The semiconductor system of claim 19, wherein the flag signal generator latches the test signal in synchronization with a rising edge of the synthetic clock signal to generate the flag signal.

22. The semiconductor device of claim 14, wherein the test signal includes a data signal, an address signal, or a command signal.

* * * * *